(12) United States Patent
Hayakawa

(10) Patent No.: US 7,144,265 B2
(45) Date of Patent: Dec. 5, 2006

(54) SOCKET FOR ELECTRIC COMPONENT

(75) Inventor: Kenji Hayakawa, Saitama (JP)

(73) Assignee: Enplas Corporation, Saitama-Ken (JP)

( * ) Notice: Subject to any disclaimer, the term of this patent is extended or adjusted under 35 U.S.C. 154(b) by 0 days.

(21) Appl. No.: 11/217,401

(22) Filed: Sep. 2, 2005

(65) Prior Publication Data

US 2006/0040540 A1    Feb. 23, 2006

Related U.S. Application Data

(63) Continuation of application No. PCT/JP2004/017505, filed on Nov. 25, 2004.

(30) Foreign Application Priority Data

Nov. 28, 2003  (JP) .............................. 2003-399512

(51) Int. Cl.
*H01R 13/62* (2006.01)
(52) U.S. Cl. ........................................ 439/331; 439/72
(58) Field of Classification Search ................ 439/331, 439/72, 73, 266, 733
See application file for complete search history.

(56) References Cited

U.S. PATENT DOCUMENTS

| 5,611,697 | A | | 3/1997 | Rall et al. | |
|---|---|---|---|---|---|
| 5,733,132 | A | * | 3/1998 | Belopolsky et al. | 439/73 |
| 5,752,846 | A | * | 5/1998 | Abe | 439/266 |
| 5,788,513 | A | * | 8/1998 | Kajiwara et al. | 439/72 |
| 6,045,382 | A | * | 4/2000 | Tohyama et al. | 439/266 |
| 6,062,874 | A | * | 5/2000 | Matsuda et al. | 439/73 |
| 6,146,173 | A | * | 11/2000 | Yagi | 439/266 |
| 6,533,595 | B1 | * | 3/2003 | Yamada | 439/266 |
| 6,743,033 | B1 | * | 6/2004 | Tateishi et al. | 439/266 |
| 2003/0109163 | A1 | * | 6/2003 | Shimada | 439/331 |
| 2003/0114034 | A1 | * | 6/2003 | Sano et al. | 439/331 |
| 2003/0194898 | A1 | * | 10/2003 | Hachuda | 439/331 |

FOREIGN PATENT DOCUMENTS

| JP | 5-27989 | 4/1993 |
|---|---|---|
| JP | 6-73888 | 10/1994 |
| JP | 9219265 | 8/1997 |
| JP | 11251021 | 9/1999 |
| JP | 11354239 | 12/1999 |
| JP | 2000182738 | 6/2000 |
| JP | 2002181881 | 6/2002 |
| JP | 2002343520 | 11/2002 |
| JP | 2004228042 | 8/2004 |

* cited by examiner

*Primary Examiner*—Tulsidas C. Patel
*Assistant Examiner*—Vladimir Imas
(74) *Attorney, Agent, or Firm*—Baker & Hostetler LLP

(57) ABSTRACT

A socket for an electric component is provided with a socket main body having a part for accommodating an electric component and a plurality of first contact pins, and a socket covering vertically movably mounted to the socket main body. A second contact pin is attached to the socket main body, and a pressing member provided for the socket main body. A retaining part extends from a lower end part of a contacting part and an elastic part extends in a direction opposite to the retaining part. The retaining part is subjected to application of a pressing force exerted by a pressing member.

12 Claims, 7 Drawing Sheets

SOCKET FOR ELECTRIC COMPONENT

This application is a continuation of PCT/JP2004/017505, filed on Nov. 25, 2004.

BACKGROUND OF THE INVENTION

1. Field of the Invention

The present invention relates to a socket for electric component for removably holding an electric component, such as an IC package, and connecting it to another electric circuit apparatus, and more particularly, to a socket for electric component which positively secures an electric component in a rigidly connected condition while causing a contact pin or pins to be elastically brought into contact with an electrode surface provided on the bottom of the electric component.

2. Description of the Related Art

Conventional sockets for electric component of this type, especially, a conventional socket for electric component of the open top type has an accommodating part for an electric component in the top, a socket main body to which a plurality of contact pins to be connected to the leads of an electric component accommodated in the accommodating part are attached, and a socket covering which is vertically movably mounted on the top side of this socket main body, and is operated by its vertical movement for clamping the leads of an electric component accommodated in the accommodating part of the socket main body with the contact pins for connection and securing.

With an IC package as an electric component to be connected and secured by means of the conventional socket for electric component of the open top type, a number of leads are arranged in line while being jutted out at both side edge parts of the package main body, or are arranged in line while being jutted out at all the four side edge parts of the package main body. To connect and secure such an IC package to the socket for electric component, the socket covering which is vertically movably mounted on the top side of the socket main body is pressed down to open the contact pins provided at the periphery of the accommodating part of the socket main body, and in this state, the leads of the IC package are accommodated in the above-mentioned accommodating part. Thereafter, canceling the pressing down of the above-mentioned socket covering permits the socket covering to move up with respect to the socket main body, closing the above-mentioned contact pins to thereby clamp the leads of the IC package accommodated in the accommodating part with a prescribed pressing force for connection and securing this IC package to the socket for electric component.

[Patent Document 1] Unexamined laid-Open Patent Publication No. 2000-182738

Nevertheless, with some of the recently available IC packages, an electrode surface made of a metallic piece for heat dissipation, grounding or supplying power is provided on the bottom of the package, in addition to the ordinary leads. To cope with such an IC package, a socket for electric component that is equipped with a separate contact pin for contacting with the electrode surface on the bottom of the package has been demanded. However, a socket for electric component which is capable of meeting this demand by positively connecting and securing an electric component while permitting the separate contact pin to come in contact with the electrode surface provided on the bottom of the electric component has not yet been provided.

When it is intended to realize such a socket for electric component, there arises a problem that, for the above-mentioned IC package having the electrode surface on the package bottom, the separate contact pin must be jutted upward in the vicinity of the central part of the socket main body. Thus when the socket covering is pressed down to open the contact pins provided at the periphery of the accommodating part of the socket main body for accommodating the leads of the IC package in the above-mentioned accommodating part, and when the pressing down of the socket covering is then cancelled so as to cause the socket covering to move up with respect to the socket main body, the contact pins must be closed for clamping the leads of the package to secure them before the upward moving of the socket covering. Otherwise, the above-mentioned separate contact pin would pop up the bottom of the IC package, which would make it impossible to connect and secure the IC package to the socket for electric component.

Therefore, the socket construction must be such that the leads of the IC package accommodated in the accommodating part are clamped by the contact pins for connection and securing before the contacting part of the separate contact pin being brought into contact with the electrode surface of the IC package. Nevertheless, for example, with a socket for electric component for use with an SOP (Small Outline Package), in which the contact pins are provided at the opposed two side edge parts of the accommodating part, or a socket for electric component for use with a QFP (Quad Flat Package), in which the contact pins are provided at all the four side edge parts of the accommodating part, the existence of the numerous contact pins has made it difficult to incorporate a structure for controlling the operation of the above-mentioned separate contact pin.

SUMMARY OF THE INVENTION

Therefore, an object of the present invention that was made in view of the described circumstance is to provide a socket for electric component which is configured to positively connect and secure an electric component before a separate contact pin is permitted to elastically come in contact with the electrode surface provided on the bottom of the electric component.

To achieve the above-mentioned object, in accordance with the present invention, there is provided a socket for electric component, which is provided with a socket main body having an accommodating part for accommodating therein an electric component and a plurality of first contact pins mounted thereon to be connected to terminal parts of the electric component accommodated in the accommodating part, and a socket covering which is vertically movably mounted on the socket main body, the socket for electric component including: a second contact pin which is attached to the socket main body, and which has a contacting part to be elastically contacted with a bottom of the electric component held in the accommodating part; and a pressing member which is provided for the socket main body such that it is operated in association with up and down movement of the socket covering, the pressing member applying, with the socket covering being lowered, a pressing force to the second contact pin, pressing down the contacting part, and clearing, with the socket covering being raised, the pressing force while allowing the contacting part to come in contact with the bottom of the electric component secured in the accommodating part.

According to such a configuration, the pressing member which is provided for the socket main body such that it is operated in association with the up and down movement of the socket covering, applies a pressing force to the second contact pin, pressing down the contacting part with the socket covering being lowered, and clears the pressing force with the socket covering being raised, causing the contacting part to elastically be in contact with the bottom of the electric component secured in the accommodating part. Thereby, the electric component is positively held in the accommodating part for connection and securing to the first contact pins before the second contact pin being allowed to elastically come in contact with the electrode surface provided on the bottom of the electric component.

In addition, the second contact pin includes a retaining part which extends from the lower end part of the contacting part substantially in a direction perpendicular thereto and an elastic part which extends in a direction opposite to the retaining part to be eventually bent, the retaining part being subjected to application of a pressing force of the pressing member. To this effect, the retaining part extending from the lower end part of the contacting part in substantially the perpendicular direction is pressed for pressing down the contacting part.

Further, in the bottom part of the accommodating part, a moving member is vertically movably provided in a manner such that the retaining part of the second contact pin is engaged with and retained at the bottom face and the contacting part is jutted out beyond the top face; and the pressing force of the pressing member is applied to the moving member. Thus, the moving member which is provided, the retaining part of the second contact pin being retained at the bottom thereof and the contacting part being jutted out from the top thereof, is pressed down by pressing it with the pressing member, and the retaining part is pressed by pressing it with the moving member for pressing down the contacting part.

Still further, the pressing member has a first arm extending upward above the top of the socket main body, and a second arm extending to the side of the accommodating part, being formed substantially in the shape of "L", and being pivoted in the vicinity of the corner part of the L shape to be rotatable, with the first arm being butted against a sliding contact surface provided in the socket covering, and pressed to be turned with the socket covering being lowered, and the second arm applying a pressing force to the second contact pin. Thereby, the sliding contact surface of the socket covering presses the first arm of the pressing member to turn it around the pivot in the vicinity of the corner part of the L shape with the socket covering being lowered, and the second arm applies the pressing force to the second contact pin for pressing down the contacting part.

The pressing member is provided so as to extend from at least one corner part of the accommodating part in the direction of the diagonal line thereof. Hence, the pressing member which is provided so as to extend from at least one of corner parts of the accommodating part in the direction of the diagonal line defined in relation to the accommodating part may press down the contacting part.

In addition, the pressing member is set up so as to extend through a channel part formed to provide a passageway continuously passing from inside to outside in the bottom of at least one guide pole vertically arranged at four corner parts of the accommodating part. Hence, the pressing member may be permitted to rotate in the channel part formed to extend from inside to outside in the bottom of the guide pole vertically arranged at the four corner parts of the accommodation.

Further, the pressing member is formed by bending the first arm from the direction of the diagonal line of the accommodating part to the direction substantially perpendicular to the side edge of the accommodating part in the vicinity of the corner part of the L shape. Hence, the pressing force of the socket covering is applied to the first arm of the pressing member in the direction perpendicular to the side edge of the accommodating part for pressing down the contacting part with the second arm extending in the direction of the diagonal line of the accommodating part.

In addition, the sliding contact surface of the socket covering is formed on the inside surface thereof. Hence, the sliding contact surface formed on the inside surface of the opening part of the socket covering can press the pressing member in compliance with the lowering of the socket covering.

Further, the above-mentioned sliding contact surface of the socket covering is formed on the inside surface of the socket covering to be located at a recess part of that covering, which is vertically recessed in the bottom of the socket covering and is positioned on the side opposite to the accommodating part. Therefore, the sliding contact surface provided in the recess part vertically provided in the bottom of the socket covering and positioned on the side opposite to the accommodating part can press the pressing member while the socket covering is being lowered.

Still further, the above-mentioned sliding contact surface is formed on the sloping portion of which an upper end part is located closer to the inside of the above-mentioned accommodating part than the lower end part of the sliding contact surface. Hence, the sloping portion of which the upper end part is located closer to the inside of the accommodating part than the lower end part operates to press the first arm of the pressing member thereby causing rotation of the first arm in response to the downward movement of the socket covering.

In addition, since the above-mentioned sliding contact surface is formed on the sloping portion of which the upper end part is located closer to the inside of the accommodating part than the lower end part, and since the sliding contact surface has a part thereof which extends from the riddle of the above-mentioned sloping portion to be in parallel with the moving direction of the socket covering, the sloping portion of the sliding contact surface initially can operate so as to press the pressing member in compliance with the lowering of the socket covering to thereby result in pressing down the contacting part of the first contact pin, while when the socket covering is further lowered, the above-mentioned surface extending in parallel with the moving direction of the socket covering instead operates so as to no longer cause any pressing operation of the pressing member and thus, the pressing-down of the contacting part is stopped.

Preferably, in accordance with a preferred embodiment of the present invention, the socket for electric component is adapted such that, due to the lowering of the socket covering, the contacting part of the second contact pin is pressed down by the pressing force of the pressing member, but due to the socket covering lifting of the socket covering, the pressing force is removed so as to cause the contacting part to be in elastic contact with the bottom of the electric component secured in the accommodating part. Therefore, the electric component can be positively held in the accommodating part for connection and securing of the terminal parts to the first contact pins before the second contact pin being caused to come in elastic contact with the bottom of the electric component. Accordingly, an unfavorable motion of the second contact pin, which could be referred to as a "pop-up phenomenon", and in which the second contact pin pops up the electric component when coming in contact with the bottom of the electric component, can be avoided to prevent the holding condition of the electric component from becoming unstable. Hence, the second contact pin can positively and steadily come in contact with the bottom of the electric component, which allows not only heat dissipation of and grounding of the electric component but also supply of a large amount of electric current to the electric component.

In addition, preferably, the socket for electric component is adapted such that the pressing force of the pressing member is directly, or indirectly through the moving member, applied to the retaining part extending from the lower end part of the contacting part substantially in the direction perpendicular thereto, whereby the point of action can be separated from the turning fulcrum point which is located in the vicinity of the elastic part of the second contact pin. Therefore, with a low force, the contacting part can be easily pressed down.

Further preferably, the socket for electric component is adapted such that the pressing member formed substantially in the shape of "L" is rotatable, being pivoted in the vicinity of the corner part of the L shape, whereby the sliding contact surface of the socket covering presses the first arm with the socket covering being lowered, and the contacting part of the second contact pin can be pressed down with the second arm. On the other hand, when the socket covering is raised, the elastic resilience of the elastic part of the second contact pin raises the second arm, and thus the pressing member can easily be restored to the initial state. Therefore, there is no need for providing a special mechanism, such as a return spring, for the pressing member, which results in a simple construction.

Still further, in accordance an embodiment of the present invention, the pressing member is provided so as to extend from at least one of corner parts of the accommodating part in the direction of the diagonal line in relation to the corner parts, whereby, even when the present invention is applied to an electric component which is provided with a plurality of terminal parts at all four side edge parts of the electric component main body, the pressing members can be set up with no interference by the existence of the plurality of contact pins provided at all of the four side edge parts of the accommodating part for connection with these terminal parts. Therefore, even when the present invention is applied to the above-mentioned type of electric component, the contacting part of the second contact pin can easily be pressed down in compliance with the lowering of the socket covering.

Preferably, the pressing member may be disposed at the corner parts of the accommodating part. Therefore, the vacant or unoccupied space of the socket main body may be effectively utilized for disposing the pressing members.

In additional embodiment of the present invention, the pressing member may be disposed at the corner parts of the accommodating part with no interference with the spring-loaded shafts provided at the four corner parts of the socket covering. Therefore, also in this case, the vacant space of the socket for electric component can be effectively utilized.

Further preferably, the inside surface of the opening part in the socket covering or the inside surface on the opposite side of the accommodating part in a recess part vertically formed in the bottom of the socket covering for prevention of deformation due to the shrinkage of the socket covering resin molded, for example, can be utilized as the sliding contact surface. Therefore, the existing surface can be formed as the sliding contact surface, and thus formation of a sliding contact surface becomes easy.

Still further preferably, the sliding contact surface is formed on the slope part which upper end part is located closer to the inside of the accommodating part than the lower end part, whereby, with the socket covering being lowered, the slope part can press the first arm of the pressing member to turn it. Therefore, with the socket covering being lowered, the pressing force for pressing the contacting part of the second contact pin can be generated in the second arm.

In one embodiment of the present invention, the sliding contact surface is preferably formed on the slope part which upper end part is located closer to the inside of the accommodating part than the lower end part, and from the upper end of the slope part, is formed so as to be in parallel with the moving direction of the socket covering, whereby the rotation of the pressing member which is in synchronism with the lowering of the socket covering can be ceased for ceasing the pressing down of the contacting part of the second contact pin from the upper end of the slope part without the further lowering of the socket covering being followed up. Therefore, the amount of pressing down of the contacting part of the second contact pin can be controlled, and a trouble that the contacting part is pressed down beyond the limit of elasticity to be destructed, becoming impossible to be restored to the original state, can be prevented. In addition, the timing at which the second contact pin is brought into contact with the bottom of the electric component can be delayed with respect to the timing of the electric component is secured, which can eliminate the problem of popup of the electric component.

PREFERRED EMBODIMENT OF THE INVENTION

Figure 1:
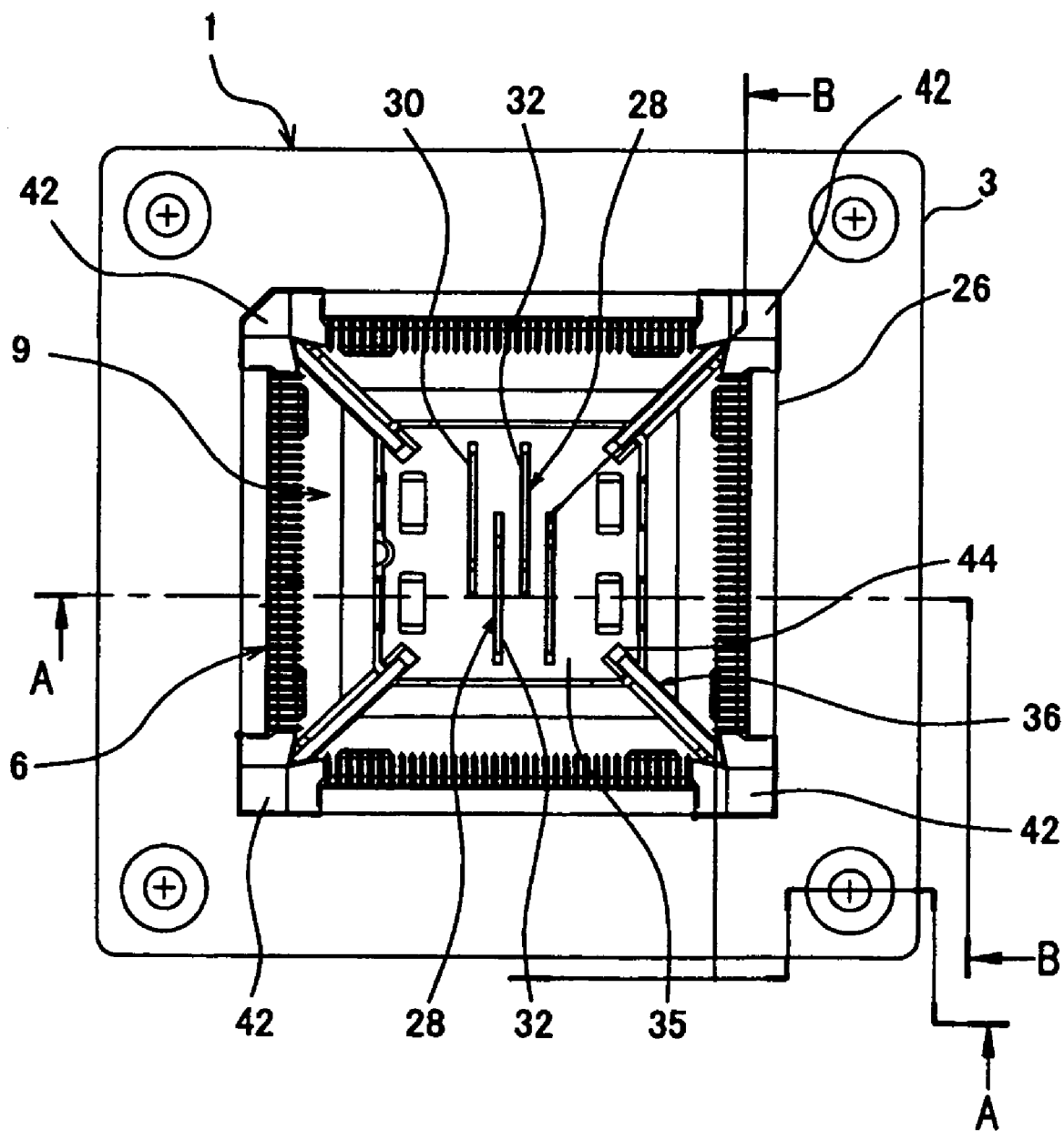
FIG. 1 is a plan view illustrating an embodiment of a socket for electric component according to the present invention.
Figure 2:
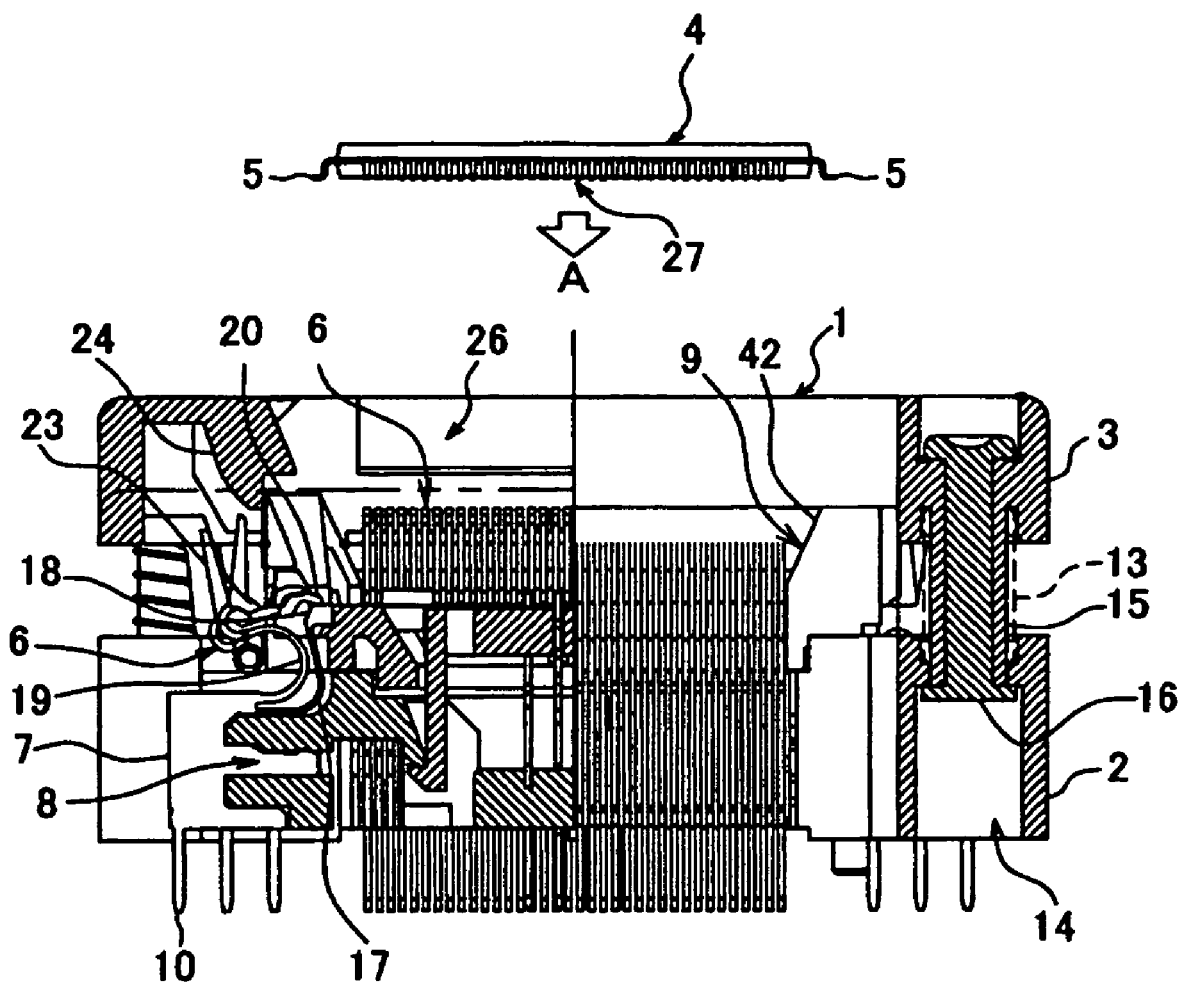
FIG. 2 is a sectional view taken on line A—A in FIG. 1.
Figure 3:
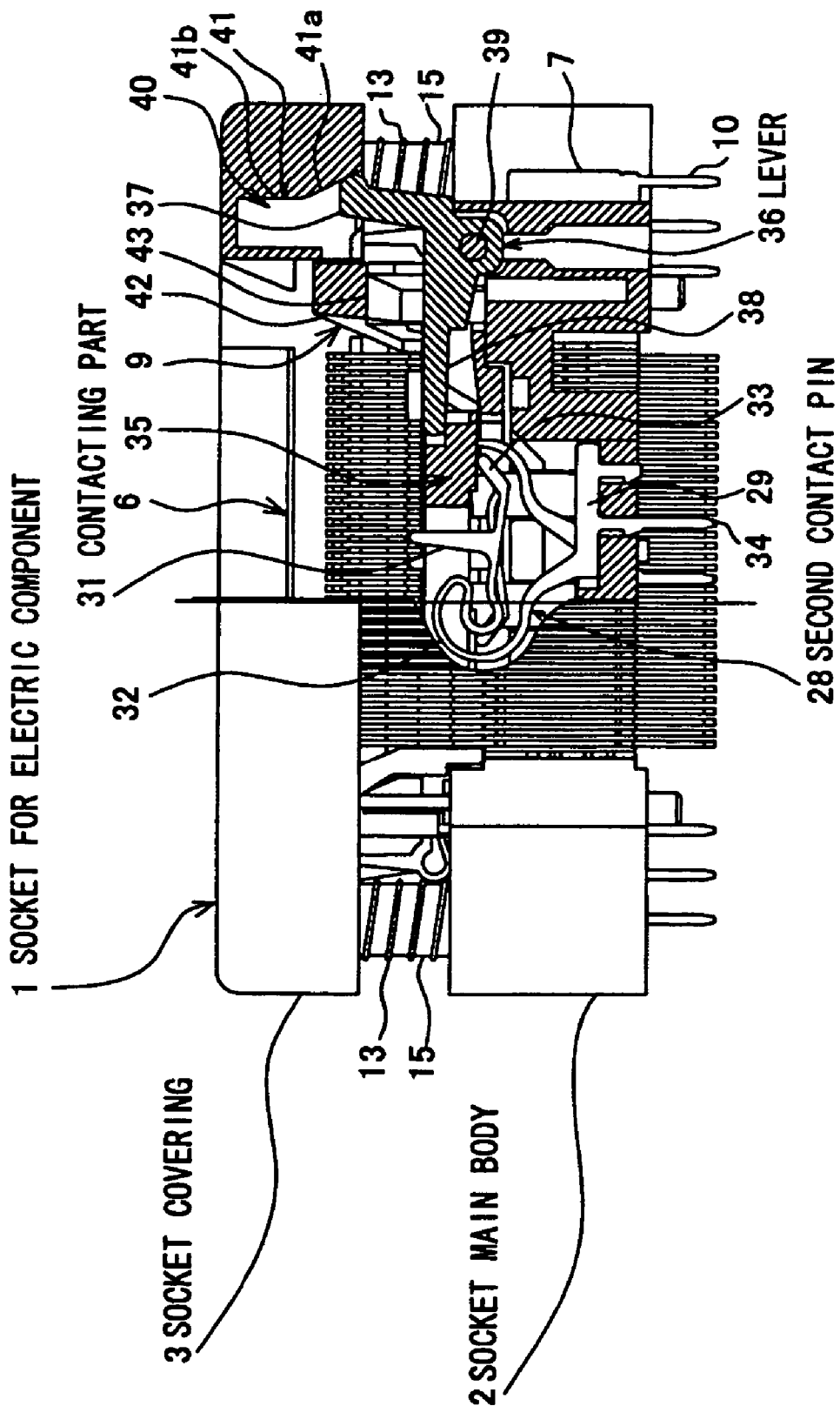
FIG. 3 is a sectional view taken on line B—B in FIG. 1.

Hereinbelow, an embodiment of the present invention will be described with reference to the accompanying drawings. FIG. 1 is a plan view illustrating an embodiment of a socket for electric component according to the present invention, FIG. 2 is a sectional view taken on line A—A in FIG. 1, and FIG. 3 is a sectional view taken on line B—B in FIG. 1. This socket for electric component generally designated by reference numeral "1" removably holds an electric component, such as an IC package, to be connected to another electric circuit apparatus (a test apparatus) in the burn-in test, the electrical continuity test or the like for eliminating the initial failure in an IC package or the like, and as shown in FIG. 2, the socket for electric component 1 comprises a socket main body 2 and a socket covering 3.

An IC package 4 as an electric component essentially consists of a rectangular package main body that encloses therein an electric device, and is provided with a plurality of leads 5 which, in some units, are jutted out, arranged in line, as a plurality of terminal parts at both side edge parts of the package main body, and in other units, are jutted out, arranged in line, as a plurality of terminal parts at all the four side edge parts of the package main body. Herein, as an example, a QFP type of IC package, in which a large number of leads 5 are jutted out at the four side edge parts of the package main body, will be described. In addition to the regular leads, the IC package 4 is provided with an electrode surface 27 made of a metallic piece for heat dissipation, grounding or supplying power on the bottom face of the package.

The above-mentioned socket main body 2 accommodates and positions the IC package 4, having a seating plate 9 forming a part to accommodate the IC package 4 in the top portion thereof as shown in FIG. 2, and a plurality of first contact pins 6, which are attached thereto for being connected to the leads 5 of the IC package 4 to be accommodated on the seating plate 9. At the four corner parts of the seating plate 9, guide poles 42 to accommodate the IC package 4 in position on the seating plate 9 are provided as shown in FIG. 1, and in each guide pole 42, a channel part 43 is formed as shown in FIG. 3, and a later described lever 36 is set up. As shown in FIG. 2, a stem part 7 of each of the first contact pins 6 is inserted into a pin mounting groove 8 in the socket main body 2. Further, any two adjacent first contact pins 6 are partitioned by a rib formed on the socket main body 2 such that they are prevented from being contacted with each other for mutual insulation. In FIG. 2, a reference numeral "10" designates connection arms projecting downward from the stem part 7 of respective one of the above-mentioned contact pins 6, and the connection arm 10 is adapted to connect to an electric circuit apparatus (not shown).

To the top side of the above-mentioned socket main body 2, the socket covering 3 is vertically movably assembled. This socket covering 3 is operated by its vertical movement such that the leads 5 of the IC package 4 to be accommodated in the accommodating part (on the seating plate 9) of the socket main body 2 are clamped by the first contact pins 6 for connection and securing. The socket main body 2 and the socket covering 3 are made of an insulating plastic material, respectively.

Between the above-mentioned socket main body 2 and the socket covering 3, one cover spring 13 is disposed at the respective four corner parts (see FIG. 2 and FIG. 3). Specifically, as shown in FIG. 2, a spring-support shaft 15 is jutted downward, and around this spring-support shaft 15, the cover spring 13 is wound, the spring-support shaft 15 being slidably inserted in a cavity 14 formed in the socket main body 2. Herein, the socket covering 3 is assembled to the socket main body 2 such that each cover spring 13 is compressed by a prescribed amount, and thus is raised, being always energized upward by the cover spring 13, with the raised position being fixed by stopper means 16.

Next, the construction of the details and the operation of the respective first contact pins 6, which are operated by the socket covering 3, which in turn is moved vertically on the top side of the above-mentioned socket main body 2, will be described with reference to FIG. 4. The first respective contact pin 6 is made of a material such as beryllium copper having excellent electric conductivity and mechanical elasticity, and has a first contacting part 18 formed on the stem part 7 as shown in FIG. 2 through a first elastic part 17 as shown in FIG. 4, and a second contacting part 20 similarly formed on the stem part 7 through a second elastic part 19.

Figure 4:
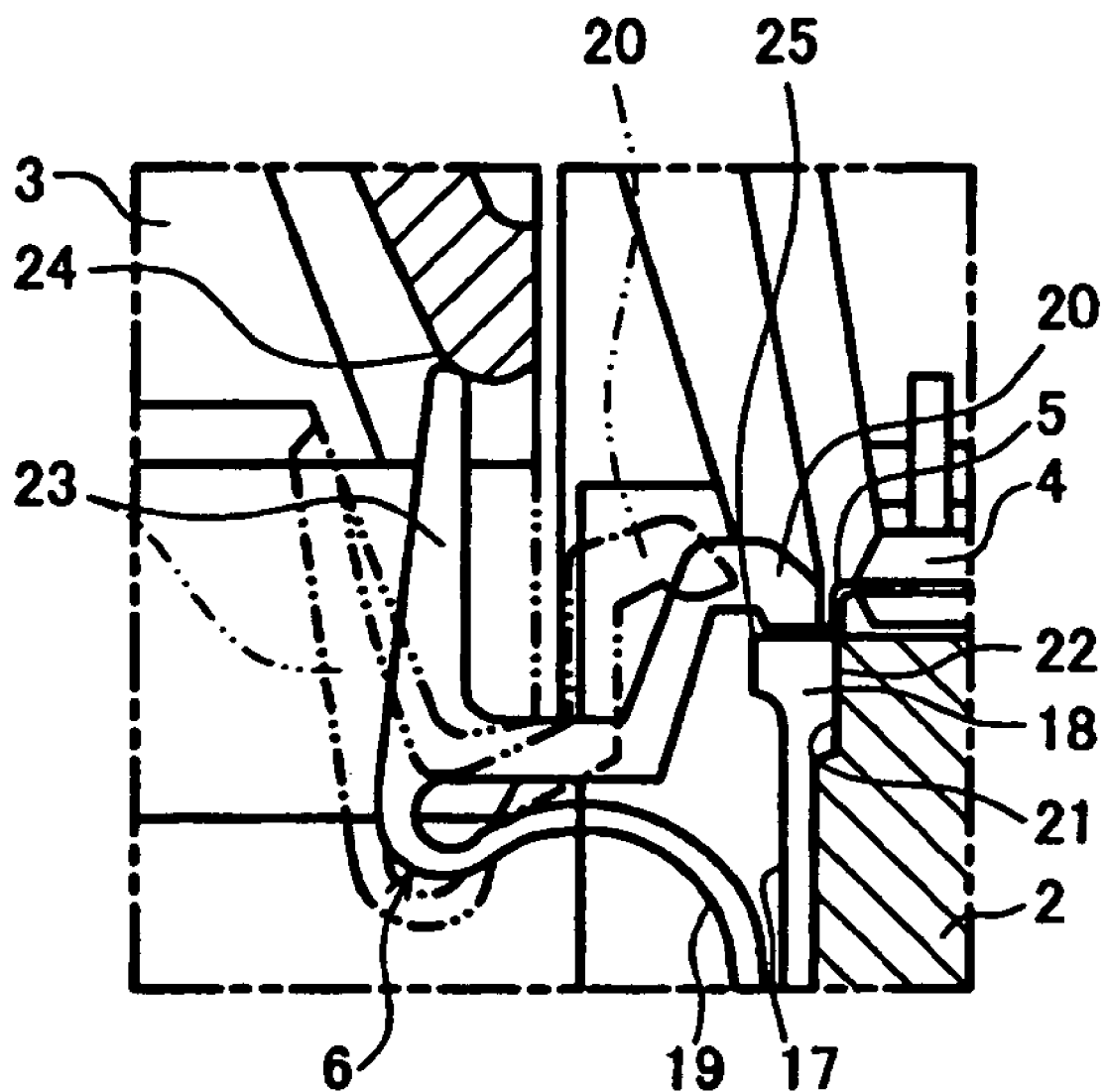
FIG. 4 is an enlarged sectional view of the critical part illustrating the construction of the details and the operation of the first contact pin mounted in the socket main body.

Among these, the first elastic part 17 and the first contacting part 18 are adapted to be engaged with a pin supporting part 21 of the socket main body 2 when both parts 17 and 18 are brought in an elastically deformed state in any position from the position where they are inclined toward the center of the socket main body 2 to the upright position in FIG. 4. Further, a rear end face 22 of the first contacting part 18 is pressed against the side face of the pin supporting part 21 by the elastic force of the first elastic part 17. As a result of this, the first contacting part 18 is positioned such that it is not displaced in a direction corresponding to the right and left direction in FIG. 4. In addition, in FIG. 4, even when the first contacting part 18 clamps the lead 5 of the IC package 4 in cooperation with the second contacting part 20, the frictional resistance force generated due to contact of the first contacting part 18 with the side face of the pin supporting part 21 and the rigidity of the first elastic part 17 prevent the first contacting part 18 from being easily displaced in the vertical direction in FIG. 4, so that the lead 5 of the IC package 4 may be clamped at a prescribed contact pressure.

Furthermore, the second elastic part 19 has, at the upper end part thereof, an arm 23 extended upward in the illustration of FIG. 4. When the socket covering 3 is pressed down against the spring force of the cover spring 13, the arm 23 is pressed by a pressing part slope 24 that is formed to have a cross-sectional shape of a circular arc or straight line inside the socket covering 3, and is moved from the position shown by a solid line to another position shown by the dashed dotted line in FIG. 4.

At this stage, the second elastic part 19 is elastically deformed in a counterclockwise direction in FIG. 4. As a result, the second contacting part 20 is retracted so as to uncover an upper end face 25 of the first contacting part 18 and thus, the upper end face 25 of the first contacting part 18 comes into an exposed state thereof. In this state, the IC package 4 is placed inside the socket covering 3 in a direction of an arrow "A" from a package insertion window 26 (see FIG. 2) provided as an open part of the socket covering 3, and is accommodated in the accommodating part (on the seating plate 9) such that every lead 5 of the IC package 4 is seated on the upper end face 25 of the first contacting part 18.

Thereafter, when the pressing-down force having been applied to the socket covering 3 is released, the socket covering 3 is moved up to the original position by the spring force of the cover spring 13. As a result the second elastic part 19 elastically returns in a clockwise direction from the dashed dotted line position to the solid line one in FIG. 4, so that the second contacting part 20 presses down the associated lead 5 of the IC package 4 against the upper end face 25 of the first contacting part 18 with the elastic force of the second elastic part 19. Thus, the lead 5 of the IC package 4 is clamped between the first contacting part 18 and the second contacting part 20 at a prescribed contact pressure for positive connection and securing. In this state, the IC package 4 is electrically connected to an electric circuit apparatus (not shown) through the contact pins 6 for carrying out the required electrical test.

With the embodiment of the present invention shown in FIG. 3, each of second contact pins 28 is provided in the vicinity of the central part of the socket main body 2 so that a contacting part 31 of the pin 28 is in elastic contact with the electrode surface 27 (see FIG. 2) provided in the bottom face of the IC package 4. Specifically, insertion holes are provided in the vicinity of the central part of the socket main body 2, and the stem part 29 of the second contact pin 28 is inserted in the insertion holes, so that the second contact pin 28 is mounted. The upper part of each second contact pin 28 is inserted into a slit 30 (see FIG. 1) opened in the vicinity of the central part of a later-described floating plate 35 which is provided vertically movably with respect to the seating plate 9, and is moved due to being elastically deformed.

The second contact pin 28 is provided with a contacting part 31 thereof, which is brought to be in contact with the electrode surface 27 on the bottom face of the IC package 4, so as to be allowed for grounding, heat dissipation or supplying of electric power. The second contact pin 28 is made of a metallic material such as beryllium copper, which is excellent in conductivity and has elasticity, and permits a part thereof to be kept in contact with the bottom of the floating plate 35. The second contact pin 28 is arranged in a state where the contacting part 31 thereof is elastically deformed from a position sufficiently higher than the bottom level of the IC package 4 accommodated and secured in the accommodating part (on the seating plate 9) to a slightly protruded position. Thu, the contact pressure of the contacting part 31 to the electrode surface 27 of the IC package 4 is increased to ensure a positive electric connection between the contacting part 31 and the electrode surface 27. Further, the floating plate 35 is always urged upward while allow a vertical movement thereof. More specifically, the second contact pin 28 is provided with a retaining part 33, which extends from the lower end part of the contacting part 31 substantially in the direction perpendicular to that part 31, and an elastic part 32, which extends in the direction opposite to the retaining part 33, and is bent.

The retaining part 33 is kept in engagement with the bottom of the floating plate 35. Therefore, in compliance with lowering of the floating plate 35, the retaining part 33 is pressed down due to elastic deformation of the elastic part 32 around a part thereof acting as a fulcrum. The second contact pin 28 is further provided with a connection part 34, which is projected from its stem part 29 through the socket main body 2 toward the opposite side of that socket main body 2. In the embodiment of FIG. 1, four second contact pins 28 are provided in parallel with one another, and are set up such that the elastic parts 32 of the four second contact pins 28 are alternately positioned on the opposite side.

In the central part of the seating plate 9, an opening part is formed to arrange the above-mentioned floating plate 35, which may serve as the bottom of the accommodating part. The floating plate 35 is provided to act as a moving member for pressing down the contacting part 31 of the second contact pin 28, and is arranged so as to permit the retaining part 33 of the second contact pin 28 to be in engagement with the bottom thereof. The floating plate 35 is thus pressed by a later-described lever 36 so as to press down the contacting part 31 of the second contact pin 28, in compliance with the lowering of the socket covering 3. On the other hand, when the socket covering 3 is moved up, the floating plate 35 is urged upward by the elastic resilience of the elastic part 32 of the second contact pin 28 to be moved up, to thereby allow the contacting part 31 to come in contact with the electrode surface 27 of the IC package 4, as shown in FIG. 2.

Further, the seating plate 9 is provided, at the four corner parts thereof, with levers 36 disposed in the directions of the diagonal lines. This lever 36 is disposed to be rotated in association with the vertical movement of the socket covering 3, so as to press down the contacting part 31 via the floating plate 35, and as shown in FIG. 3, the lever 36 has a first arm 37 extending upward above the top of the socket main body 2, and a second arm 38 extending to the side of the accommodating part (the seating plate 9), which are arranged to be formed substantially in an "L" shape element, and is arranged to be rotatable with respect to the socket main body 2 via a pivot pin 39 disposed in the vicinity of the corner part of the L-shape element. More specifically, the lever 36 is formed by angling the first arm 37 from the direction of the diagonal line of the accommodating part (the seating plate 9) to the direction substantially perpendicular to the side edge of the same accommodating part (the seating plate 9) in the vicinity of the corner part of the L-shape element, and thus permits the first arm 37 to be accommodated in a recess part 40 vertically recessed in the bottom of the socket covering 3. Also, the lever 36 permits the second arm 38 thereof to be set up so that it penetrates through a channel part 43 that is formed to provide a communication from inside to outside of respective guide poles 42 disposed at the four corner parts of the seating plate 9. Thus, the second arm 38 is engaged, at a nose end part thereof, with a retaining groove part 44 formed at the four corner parts of the floating plate 35, as shown in FIG. 1. The inside surface of the recess part 40 provided in the socket covering 3 that is provided on the side opposite to the accommodating part (the seating plate 9) is formed so as to include a sloping portion 41*a* of which an upper end part is more inclined than the lower end part so that the upper end part is located closer to the inside of the accommodating part (the seating plate 9) in comparison with the lower end part, and a perpendicular surface portion 41*b* extending from an intermediate portion of the sloping portion 41*a* to be in parallel with the direction of movement of the socket covering 3. The above-mentioned sloping portion 41*a* and perpendicular surface portion 41*b* forms a sliding contact surface 41 on which the nose end part of the first arm 37 of the lever 36 is permitted to slide.

In accordance with the above describe configuration, when the first arm 37 is abutted against the sloping portion 41*a* of the sliding contact surface 41, the nose end part of the first arm 37 is pressed by the sloping portion 41*a* in compliance with lowering of the socket covering 3, to result in allowing the lever 36 to be rotated about the pivot pin 39 while causing the second arm 38 to press down the floating plate 35. When the first arm 37 is abutted against the perpendicular surface portion 41*b*, no rotating force is applied to the lever 36 even if the socket covering 3 is lowered and thus, the movement of the lever 36 is ceased, which ceases the floating plate 35 being pressed down. The afore-mentioned recess part 40 can utilize a recess, which is typically formed to prevent deformation of the resin molded socket covering 3 due to shrinkage, and the recess part 40 is provided in a portion having a large wall thickness that is disposed by the side of the spring-support shaft 15 in the vicinity of each of the four corner parts of the socket covering 3.

FIG. 1 illustrates four second contact pins 28 which are provided in the vicinity of the central part of the socket main body 2, however, the arrangement is not limited to this embodiment, and only a single second contact pin 28 may be provided. When more than one second contact pin 28 is provided, the arrangement is suited for an application where a large current is to be supplied to the IC package 4.

Figure 5:
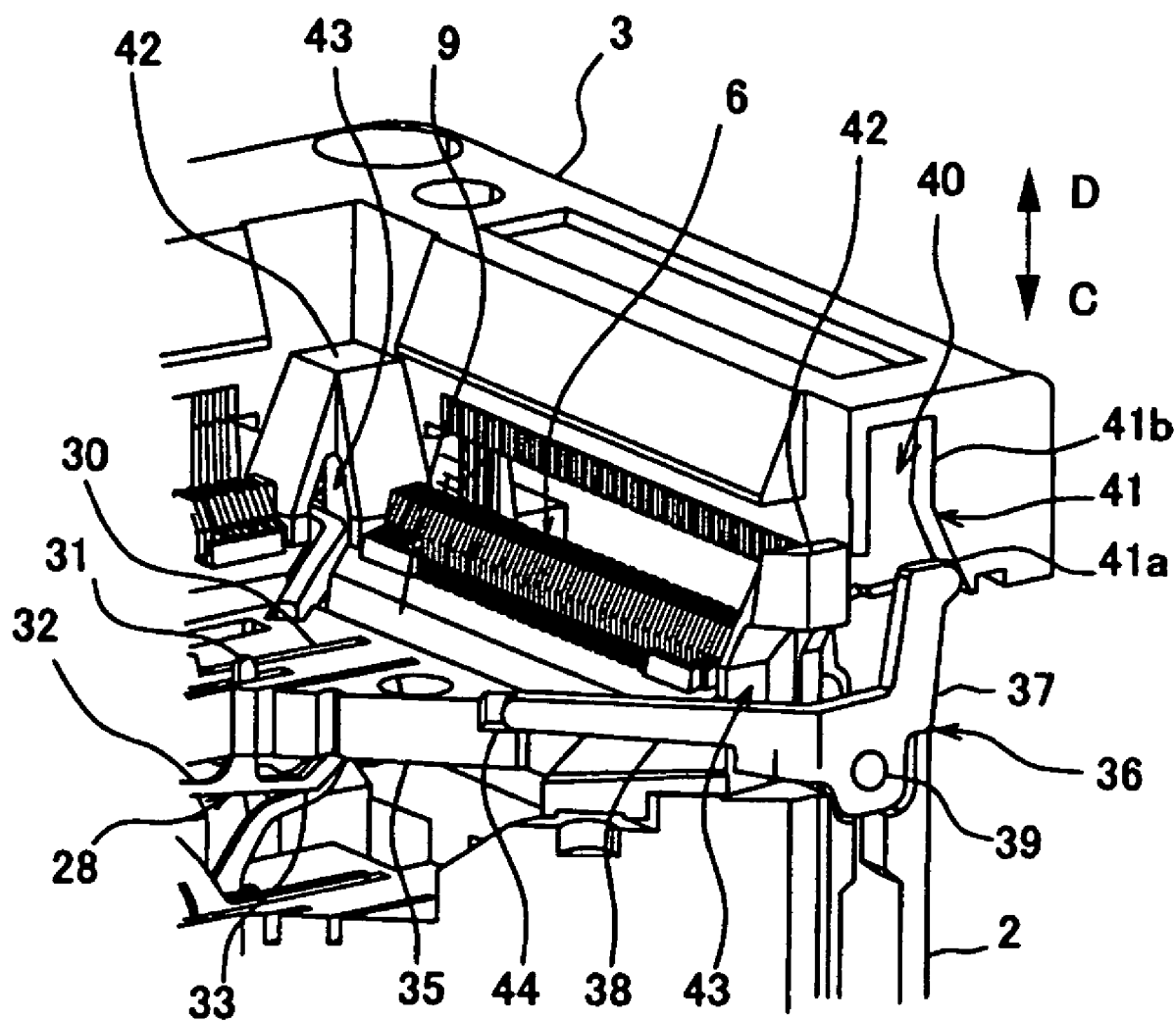
FIG. 5 is an explanatory drawing illustrating the operation of the above-mentioned socket for electric component, a drawing showing the initial stage of the operation of the lever mounted in the socket main body.
Figure 6:
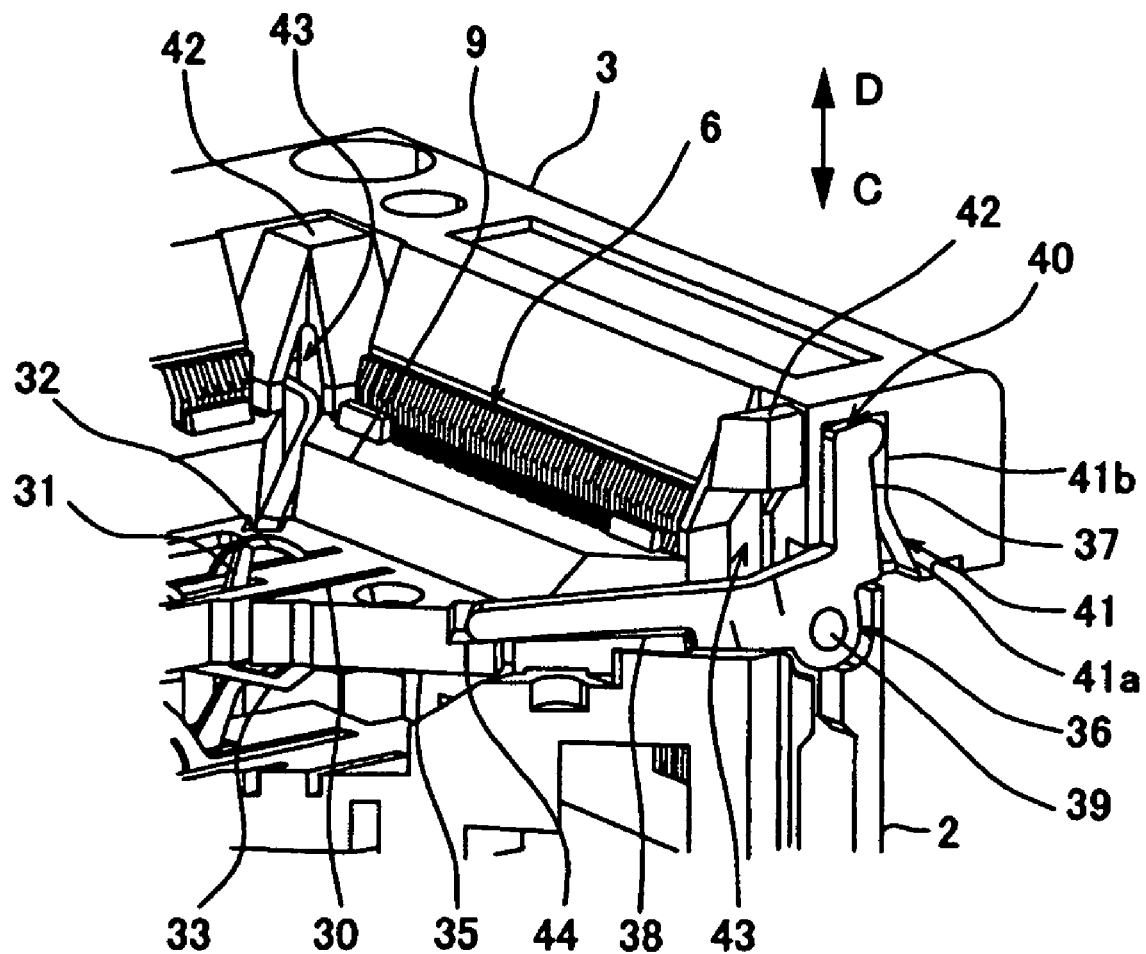
FIG. 6 is an explanatory drawing illustrating the operation of the above-mentioned socket for electric component, a drawing showing the final stage of the operation of the lever mounted in the socket main body.

Now, a description of the operation of the socket for electric component 1 thusly configured will be provided with reference to FIGS. 5 and 6. First, in FIG. 5, the socket covering 3 is initially held in the raised position before the IC package 4 being inserted. In this state, the socket covering 3 is pressed downward along the direction of the arrow "C" in FIG. 5. Then, against the urging force of the cover spring 13 acting in the upward direction as shown in FIGS. 2 and 3, the socket covering 3 is lowered In this case, the nose end part of the first lever 37 is first abutted against the sloping portion 41a of the sliding contact surface 41 in the recess part 40 formed in the socket covering 3, and in compliance with lowering of the socket covering 3, the nose end part of the first lever 37 is slid upward on the sloping portion 41a. At this stage, the nose end part of the first lever 37 is pressed by the sloping portion 41a, and the lever 36 is rotated in a counterclockwise direction in FIG. 5 about the pivot pin 39. Thus, the nose end part of the second arm 38 presses down the retaining groove part 44 of the floating plate 35 to thereby press down the floating plate 35. Then, as shown in FIG. 3, the retaining part 33 of the second contact pin 28 that is engaged with the bottom of the floating plate 35 is pressed down by the floating plate 35, and the contacting part 31 is pressed down due to an elastic deformation of the elastic part 32 provided as the intermediate part of the second contact pin 28. Therefore, the contacting part 31 is separated downward from the position where it is in contact with the electrode surface 27 of the IC package 4.

Then, until the nose end part of the first lever 37 of the lever 36 reaches the upper end of the sloping portion 41a of the sliding contact surface 41, the lever 36 is rotated in association with the lowering of the socket covering 3 and accordingly, the second arm 38 continuously presses down the floating plate 35. When the nose end part of the first lever 37 reaches the upper end of the sloping portion 41a and then transfers to the perpendicular surface portion 41b, the pressing action from the sliding contact surface 41 is cancelled, thus the rotation of the lever 36 is stopped and therefore, the pressing-down of the floating plate 35 is stopped.

Thereafter, when pressing-down of the socket covering 3 is further continued, the nose part of the first lever 37 of the lever 36 is slidably moves up on the surface of the perpendicular surface portion 41b (see FIG. 6). During this slidable movement of the first lever 37, the pressing force is any longer applied to the first lever 37 from the sliding contact surface 41 and accordingly, the lever 36 keeps stopping of rotation. Thus, the floating plate 35 maintains it's stopped state. However, only the socket covering 3 continues to be lowered in the direction of an arrow C as shown in FIG. 5. Then, with this lowering of the socket covering 3, the arm 23 of the contact pin 6 is pressed down by the pressing part slope 24 as shown in FIG. 4. Hence, the second elastic part 19 of each of the first contact pins 6 is elastically deformed, and the second contacting part 20 is retracted to uncover the upper end face 25 of the first contacting part 18 so that the upper end face 25 of the first contacting part 18 may be exposed. As a result, inside the socket for electric component 1, the accommodating part (the seating plate 9) for the IC package 4 is brought into a state ready for receiving the IC package.

In this state, the IC package 4 is inserted inside of the socket covering 3 from the package insertion window 26 formed in the socket covering 3 along the arrow A of FIG. 2, so that every lead 5 of the IC package 4 is placed on the upper end face 25 of the first contacting part 18 of the first contact pin 6, as shown in FIG. 4. Thereafter, when it is confirmed that all of the leads 5 of the IC package 4 are placed in position on the top ends 25 of the first contacting parts 18, the pressing-down force, which has been applied to the socket covering 3 is cleared.

Then, in FIG. 2 and FIG. 3, the socket covering 3 is moved up by the spring force of the cover spring 13 acting in the direction of the arrow D (FIG. 5). In this case, the nose part of the first lever 37 is first slid from the upper end part to the lower end part of the perpendicular surface portion 41b of the sliding contact surface 41 in the recess part 40 of the socket covering 3 in FIG. 6. In other words, while the floating plate 35 is kept pressed down by means of the lever 36, only the socket covering 3 is moved up in the direction of the arrow D. In this state, the contacting part 31 of the second contact pin 28 which has been pressed down by the floating plate 35 in FIG. 6 is kept lowered.

According to the moving up of the socket covering 3, the pressing part slope 24 of the socket covering 3 action to press down the arm 23 of the first contact pin 6, and thus the second elastic part 19 of the first contact pin 6 is elastically returned from the dashed dotted line position thereof to the solid line one in FIG. 4, so that the second contacting part 20 presses down the lead 5 of the IC package 4 against the upper end face 25 of the first contacting part 18 due to the elastic force exerted by the second elastic part 19. Hence, respective leads 5 of the IC package 4 are clamped between the first contacting part 18 and the second contacting part 20.

Thereafter, until the nose part of the first lever 37 of the lever 36 reaches the lower end of the perpendicular surface portion 41b of the sliding contact surface 41 in the recess part 40, the socket covering 3 is further moved up. Therefore, the respective leads 5 of the IC package 4 are clamped between the first contacting part 18 and the second contacting part 20 at a prescribed contact pressure for positive connection and securing. At this stage, the floating plate 35 is still kept lowered, and thus the contacting part 31 of the second contact pin 28 is also kept lowered.

Thereafter, the socket covering 3 is further moved up by the spring force of the cover spring 13 in the direction of the arrow D in FIG. 5. Then, in FIG. 5, the nose part of the first lever 37 is slidably moved on the sloping portion 41a from the upper to lower end parts thereof. During the moving up of the socket covering 3, the pressing force imposed on the lever 36 by the sliding contact surface 41 of the socket covering 3 is gradually cleared, and the pressing down of the retaining part 33 of the second contact pin 28 by the floating plate 35 is cancelled. Hence, the elastic part 32 of the second contact pin 28 is elastically deformed upward to lift the floating plate 35 with the retaining part 33, and at the same time, causes the lever 36 to rotate in a clockwise direction to return to the initial position, while raising the contacting part 31. Thus, as shown in FIG. 7, the contacting part 31 of the second contact pin 28 elastically comes in contact with the electrode surface 27 on the bottom of the IC package 4 for electrical connection.

Figure 7:
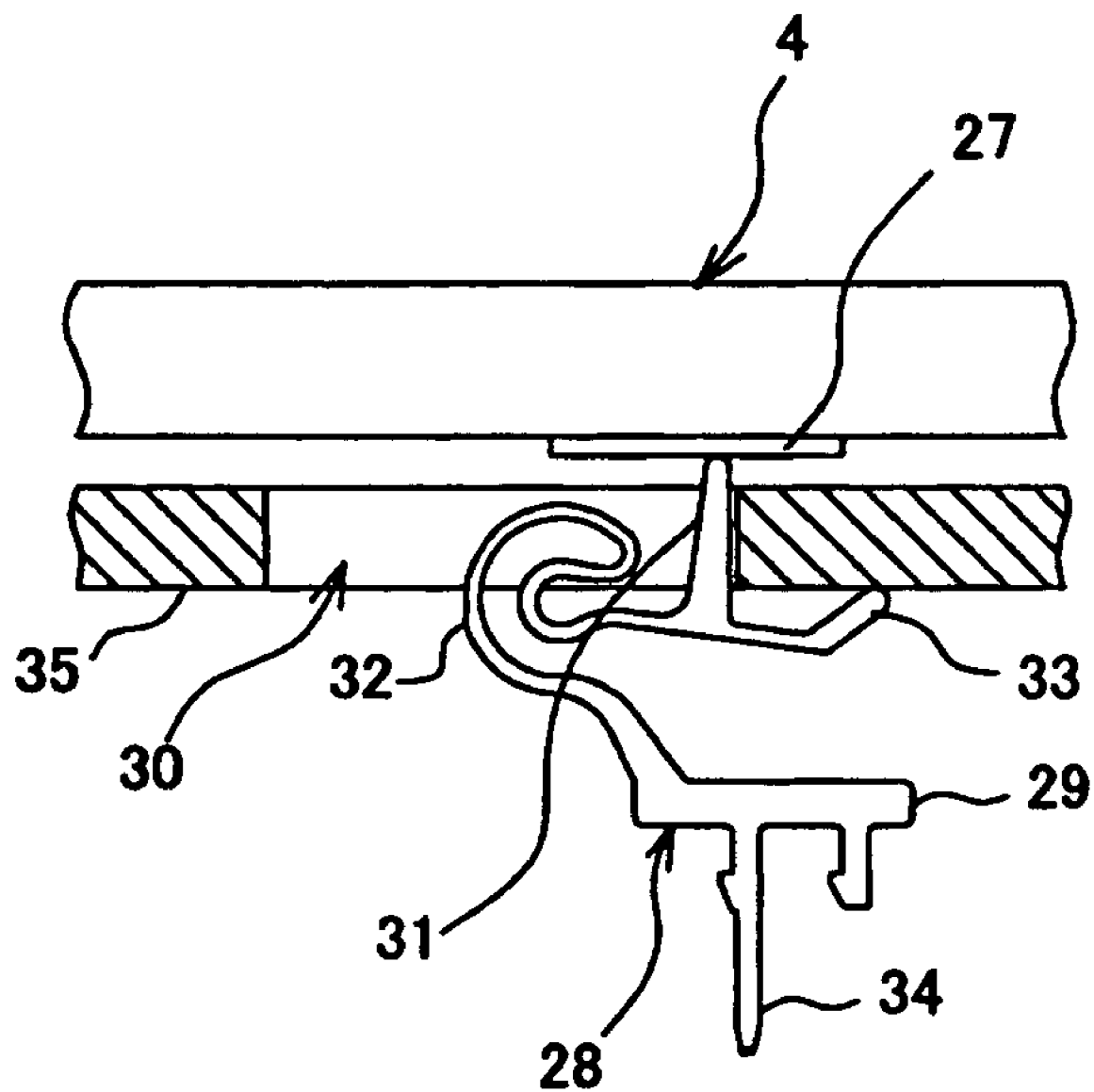
FIG. 7 is an explanatory drawing illustrating the second contact pin being in contact with the IC package.

At this time, after the respective leads 5 of the IC package 4 are clamped at a prescribed contact pressure between the first contacting part 18 and the second contacting part 20 of the first contact pin 6 as shown in FIG. 4 for the positive connection and securing, the contacting part 31 of the second contact pin 28 is brought into contact with the electrode surface 27 of the IC package 4 as shown in FIG. 7, and thus the IC package 4 can be positively connected and secured to the socket for electric component 1 without the bottom of the IC package 4 being popped up.

In this state, the electric circuit apparatus (not shown in FIGURES) and the IC package 4 are electrically connected to each other via the first contact pins 6 and the second contact pins 28 so as to carry out required electrical tests.

It should be understood that the geometries of the second contact pin 28, the floating plate 35, and the lever 36, and the assembled configuration of these respective components are not limited to those as shown in FIG. 5 through FIG. 7. Namely, these components may be of any geometries and construction, provided that the respective second contact pins 28 are constructed and arranged such that the contacting part 31 thereof is in electrical contact with the electrode surface 27 provided on the bottom of the IC package 4; the floating plate 35 is constructed and arranged such that the second contact pin 28 is pressed down due to the lowering of the socket covering 3, while when the socket covering 3 is permitted to move up, the contacting part 31 of the second contact pin 28 is urged upward so as to come in contact with the electrode surface 27 of the IC package 4; and the lever 36 is constructed and arranged such that the the lever 36 operates in association with the above-mentioned lowering of the socket covering 3 to press down the retaining part 33 of the second contact pin 28, but as soon as the contacting part 31 of the second contact pin 28 is separated from the electrode surface 27 of the IC package 4, the operation of the lever 36 to press down the retaining part 33 is stopped.

In the above description, the lever 36 is provided so as to press down the contacting part 31 of the second contact pin 28 via the floating plate 35, however, the lever 36 may be provided so as to directly press down the retaining part 33 thereby pressing down the contacting part 31.

Further, in the foregoing description, the sliding contact surface 41 of the socket covering 3 is constructed to include the sloping portion 41a and the perpendicular surface portion 41b, but it may be constructed so as to be formed to have only a sloping portion. Still further, the sliding contact surface 41 is not limited to that which is formed on the inside surface of the recess part 40 vertically provided in the bottom of the socket covering 3 that is opposite to the accommodating part (the seating plate 9), but it may be formed on the inside surface of the package insertion opening 26 in the socket covering 3.

Further, each of second contact pins 28 may be constructed such that the nose part of the contacting part 31 thereof is formed in a plate-like shape so as to be in surface contact with the electrode surface 27 of the IC package 4 so as to promote heat dissipation from the plate-like nose part.

It should further be understood that the IC package 4 to which the socket for electric component according to the present invention is applicable is not limited to the QFP type of IC package, in which leads are jutted out at the four side edge parts of the package main body, but it may be the SOP type, in which leads are jutted out at the mutually opposed two side edge parts, or may be an IC package which has connection terminals and an electrode surface 27 on the bottom of the package main body. When the present invention is applied to the SOP type of IC package, the lever 36 may be located by the side of the respective opposed two side edge parts where no IC package leads are provided, rather than at the four corner parts of the accommodating part (the seating plate 9).

Many modifications and variations will further occur to a person skilled in the art without departing from the scope and spirit of the invention claimed in the accompanying claims.

I claim:

1. A socket for electric component provided with a socket main body having an accommodating part for accommodating therein an electric component and a plurality of first contact pins mounted thereon to be connected to terminal parts of the electric component accommodated in the accommodating part, and a socket covering vertically movably mounted on the socket main body, wherein the socket for electric component comprises:
    a second contact pin attached to the socket main body, and having a contacting part to elastically be in contact with a bottom of the electric component held in the accommodating part, a retaining part, which extends from a lower end part of said contacting part in a direction substantially perpendicular to the lower end part, and an elastic part, which extends in a direction opposite to said retaining part to be eventually formed as a bent part; and
    a pressing member provided for the socket main body such that it is operated in association with up and down movement of said socket covering, said pressing member applying, with the socket covering being lowered, a pressing force to said second contact pin to press down the contacting part, and clearing, with the socket covering being moved up, said pressing force while permitting the contacting part to come in contact with said bottom of the electric component secured in the accommodating part, and
    wherein said retaining part of said second contact pin is subjected to application of the pressing force exerted by said pressing member.

2. The socket for electric component according to claim 1, wherein a moving member is vertically movably provided in a bottom part of said accommodating part, said moving member having a bottom face thereof, which is engaged with the retaining part of said second contact pin and a top face thereof beyond which said contacting part of said second contact pin is jutted out, said moving member being subjected to the pressing force exerted by said pressing member.

3. The socket for electric component according to claim 1, wherein said pressing member is formed in a substantially L-letter shape member having a first arm extending upward above the top side of said socket main body, and a second arm extending toward the side of the accommodating part, said pressing member being rotatably pivoted in the vicinity of a corner part of said L-letter shape member, the first arm being kept in contact with a sliding contact surface provided in said socket covering to thereby be pressed by said socket covering in compliance with lowering of the socket covering and to thereby cause pivotal motion of said pressing member while applying a pressing force to said second contact pin by said second arm.

4. The socket for electric component according to claim 1, wherein said pressing member is provided so as to extend from at least one of corner parts of said accommodating part in a diagonal direction defined in relation to said accommodating part.

5. The socket for electric component according to claim 1, wherein said pressing member is set up so as to extend through a channel part formed to provide a passageway continuously passing from inside to outside in a bottom of at least one guide pole vertically arranged at four corner parts of said accommodating part.

6. The socket for electric component according to claim 3, wherein said pressing member is formed by bending said first arm from the diagonal direction defined in relation to the accommodating part to a different direction substantially perpendicular to the side edge of the accommodating part in the vicinity of said corner part of the L-letter shape member.

7. The socket for electric component according to claim 3, wherein the sliding contact surface of said socket coverings is formed on an inside surface of the socket covering.

8. The socket for electric component according to claim 3, wherein sliding contact surface of said socket covering is formed on the inside surface of a recess part vertically provided in the bottom of the socket covering that is on the side opposite to said accommodating part.

9. The socket for electric component according to claim 7, wherein said sliding contact surface is formed on a sloping portion of which an upper end part is located closer to an inside of said accommodating part than a lower end part of said sliding contact surface.

10. The socket for electric component according to claim 7, wherein said sliding contact surface is formed on the sloping portion of which an upper end part is located closer to an inside of said accommodating part than a lower end part, and which, from the upper end of the slope part, is formed in parallel with the moving direction of said socket covering.

11. The socket for electric component according to claim 8, wherein said sliding contact surface is formed on a sloping portion of which an upper end part is located closer to an inside of said accommodating part than a lower end part of said sliding contact surface.

12. The socket for electric component according to claim 8, wherein said sliding contact surface is formed on the sloping portion of which an upper end part is located closer to an inside of said accommodating part than a lower end part, and which, from the upper end of the slope part, is formed in parallel with the moving direction of said socket covering.

* * * * *